United States Patent [19]

Frebault

[11] 4,433,292

[45] Feb. 21, 1984

[54] ARRANGEMENT OF A POLYCHROME CATHODE-RAY TUBE FOR OPERATION WITH A RESERVED ELECTRON GUN

[75] Inventor: Jean Claude Frebault, Paris, France

[73] Assignee: Thomson-CSF, Paris, France

[21] Appl. No.: 260,102

[22] Filed: May 4, 1981

[30] Foreign Application Priority Data

May 8, 1980 [FR] France ............................... 80 10247

[51] Int. Cl.³ ............................................ G01R 31/024

[52] U.S. Cl. .............................. 324/404; 313/477 HC

[58] Field of Search ............... 324/404, 406, 407, 408, 324/121 R; 313/417, 318, 477; 358/139

[56] References Cited

U.S. PATENT DOCUMENTS

| | | | |
|---|---|---|---|
| 3,623,135 | 11/1971 | Doggett et al. | 313/318 |
| 4,066,311 | 1/1978 | Poulson | 324/404 |

*Primary Examiner*—Michael J. Tokar

[57] ABSTRACT

A color tube so arranged as to check the operation of an electron gun reserved for a particular type of visual display such as a red warning signal and therefore not normally employed for independent operation. The arrangements contemplated preferably include direct checking for continuity of the corresponding filament circuit by means of a separate output lead from said filament, as well as checking of the emission of the reserved-gun cathode by inserting an additional anode which is intended to form a diode with said cathode. Testing by means of the additional external connections thus formed can take place by detection of current flow.

7 Claims, 3 Drawing Figures

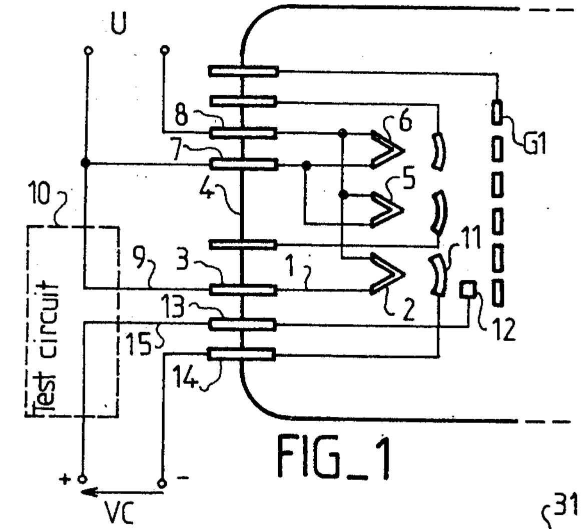
FIG_1
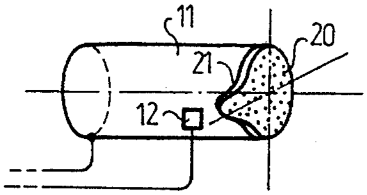
FIG_2
FIG_3
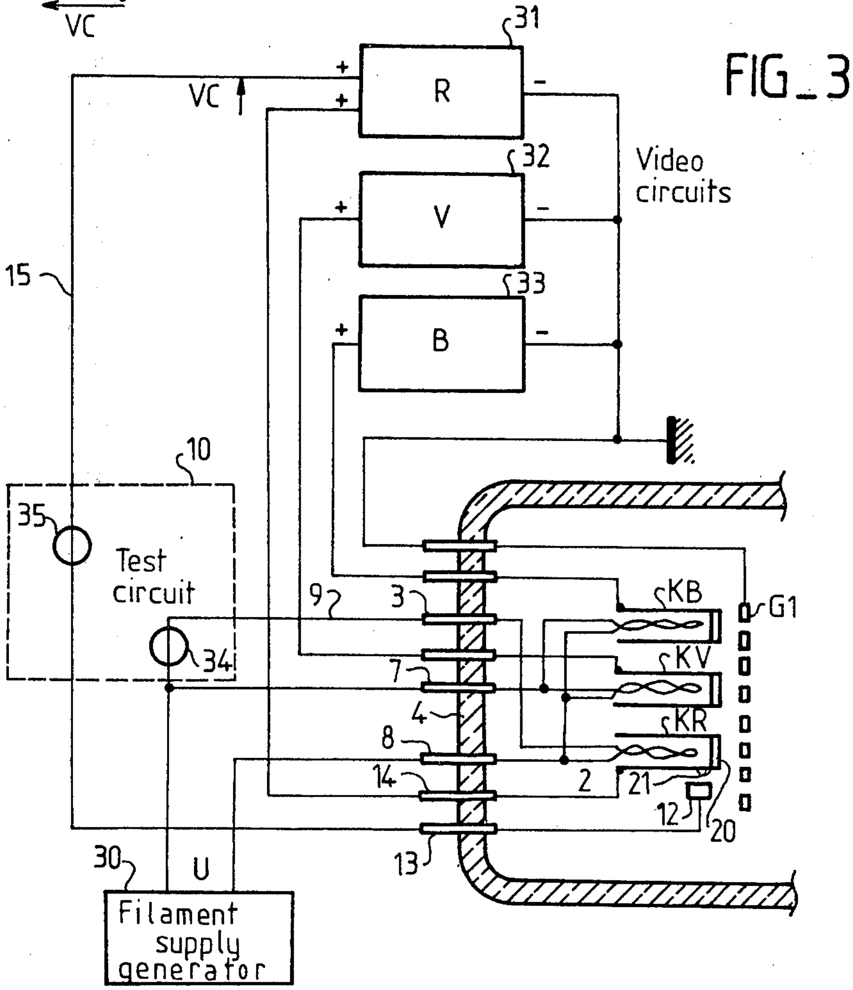

ARRANGEMENT OF A POLYCHROME CATHODE-RAY TUBE FOR OPERATION WITH A RESERVED ELECTRON GUN

This invention relates to polychrome cathode-ray tubes of the three-gun type. The so-called shadow-mask tubes fall into this category.

Especially in the field of avionics, cathode-ray tubes of this type are employed for instrument-panel display of navigation data or any other date which may be useful for aircraft pilots. In accordance with conventional practice, one of the colors (usually red) is reserved for the display of warning signals. This reserved color is not normally employed for displaying data except in conjunction with other colors, for example green in order to obtain yellow.

In these areas of application, however, a problem arises in regard to safety and reliability of equipment by reason of the fact that the above-mentioned reserved color is not displayed when no warning is given and that it proves difficult in practice to detect any failure of the cathode circuit of the tube which generates this color.

The aim of the invention is to overcome this disadvantage by modifying the structure of the cathode-ray tube in such a manner that it becomes possible to check the good performance of the electron gun which corresponds to the reserved color. Checking can accordingly be carried out by means of routine test measurements of the type employed for checking electronic circuits.

SUMMARY OF THE INVENTION

In accordance with one distinctive feature of the invention, the cathode-ray tube is equipped with checking means which, in a preferred embodiment, consist in inserting an anode in proximity to the cathode of the reserved electron gun in order to form a diode with said cathode and in bringing-out a separate supply connection for heating the filament of the reserved gun, the checking operation being carried out on the external connections which lead to the anode and to the separate heating connection.

BRIEF DESCRIPTION OF THE DRAWINGS

Other features of the invention will be more apparent upon consideration of the following description and accompanying drawings, wherein:

FIG. 1 is a simplified diagram of a polychrome cathode-ray tube arranged in accordance with the invention;

FIG. 2 is a detail diagram relating to an alternative embodiment of the cathode-ray tube arranged in accordance with FIG. 1;

FIG. 3 is a diagram showing a constructional arrangement of the cathode-ray tube in accordance with the invention together with a representation of external supply circuits and test circuits.

DESCRIPTION OF THE PREFERRED EMBODIMENTS

In accordance with the invention, the polychrome cathode-ray tube is so arranged as to permit visual control of the reserved electron gun which is put into independent operational service only on rare occasions. The arrangements are based on the fact that two elements are to be checked, namely the heating filament and the cathode of the electron gun considered. The other electrodes located upstream comprise the control grid or Wehnelt grid also designated G1, followed by the screen, focusing and accelerating grids. In accordance with current designs, each electrode is common to all three electron guns. In consequence, faulty operation of a common electrode is detected directly by observation of an image displayed visually on the screen. Two other factors have been taken into account for the arrangement of the tube: on the one hand the greater probability of a fault condition resulting from deficient heating caused by opening of the filament circuit and, on the other hand, the number of terminal contact-pins available on the base of the cathode-ray tube; this number is very limited and does not usually exceed one contact-pin. In the following description, a number of embodiments are contemplated as a function of the foregoing parameters.

The most simple embodiment will be described first although this is not a preferential form of construction. In this initial version, an end connection 1 of the filament 2 of the reserved electron gun is brought-out separately in order to terminate at an electrode output 3 consisting of a contact-pin which may be made available on the base 4 of the cathode-ray tube when the need arises. The filaments 2, 5 and 6 are normally connected in parallel within the interior of the tube. The connecting leads terminate in two heating pins 7–8 to which is applied an alternating-current or direct-current voltage U obtained from an external power source. In accordance with the arrangement shown in FIG. 1, the contact-pin 8 is common to the three filaments and the contact-pin 7 is common to the filaments 5 and 6 which remain connected in parallel. The filament 2 is supplied separately between the pins 8 and 3. The supply of current to the filament 2 thus entails the use of a connection 9 which is located outside the cathode-ray tube instead of a connection to the contact-pin 7 which is within the interior of the tube in accordance with the conventional arrangement. Said external connection 9 makes it possible to test heating of the reserved electron gun in accordance with known methods, for example by measuring the flow of current. A test circuit is represented schematically by the block 10. An alternative arrangement which is worthy of note consists in bringing-out the two end connections of the filament 2 separately. However, this form of construction calls for two additional output contact-pins instead of one contact-pin, is more difficult from a practical standpoint and is in any case not attended by any advantage.

A second embodiment relating to the arrangement of the cathode-ray tube makes it possible to locate the checking operation at the level of the cathode 11 of the reserved electron gun, namely at the level of the electron emission. An additional electrode 12 forming an anode is inserted at the time of fabrication and placed in proximity to the cathode 11. The anode 12 is connected to an electrode output 13 consisting of a terminal contact-pin which is available when the need arises. Subject to application of a direct-current voltage Vc between said contact-pin 13 and the pin 14 connected to the cathode 11, the assembly 11–12 constitutes a diode and the corresponding current detection is employed for checking the operation of the reserved electron gun. As stated earlier, the test may be performed on the external line 15 which connects an external direct-current source to the anode 12.

The cathodes of the tube are usually of cylindrical shape, the filament being located within the interior of the cylinder which is closed at one end. A coating deposited on the end wall of the cylinder is of material which generates electrons as a result of heating. The anode 12 must therefore be positioned between the end of the cathode 11 and the grid G1 in order to be located opposite to an emissive zone of the deposit. In consequence, the anode must be of very small size in order to cut-off the electron beam to the minimum extent. Furthermore, it must be considered that the interelectrode space between the cathodes and the grid G1 is small and gives rise to difficulties of fabrication and location of the anode 12 on an axial path. In order to overcome these difficulties, the deposit 20 is preferably extended on the cylindrical wall of the electron gun 11 as shown in FIG. 2 in order to form a small zone 21 and to position the anode 12 opposite to this latter. Said zone 21 may also be coated with a separate deposit with respect to the end-wall deposit 20.

The embodiment which includes an anode is preferable to the first embodiment since it also makes it possible (although indirectly) to check the heating and to detect any possible interruption of the heating circuit.

The combined use of the two embodiments represents the preferred solution, provision being made if necessary for additional electrode outputs corresponding to the output pins 3 and 13.

FIG. 3 shows a solution of this type as applicable in particular to a shadow-mask picture tube. The related circuits are composed of a circuit 30 for generating a filament supply voltage U and of video circuits 31, 32 and 33 respectively for the red, green and blue channels. Each video circuit has one output of negative polarity connected to the control grid G1 and one output of positive polarity connected to the corresponding cathode KR, KV or KB. The blocking bias voltage between grid G1 and cathode can be −70 V, for example, and the common output G1 is connected to the reference ground potential. The respective video signals are transmitted by these circuits to the cathode connections. The video circuit of the red channel has a second output of positive polarity (+100 V, for example) which is connected to the anode 12. Tests are carried out for example by means of current transformers 34, 35 placed respectively on the external connection 9 for heating the red channel and the external connection 15 for supplying the anode 12.

Known techniques can be adopted for the construction of the test circuits 10 as well as any additional outputs 3 and/or 13 for insertion of the cathode-ray tube base in its socket by means of contact-pins, that is to say in the absence of any available contact-pin.

What is claimed is:

1. A polychrome cathode-ray tube comprising:
three electron guns, each gun having a heated filament, and a cathode with an emission surface for emitting electrons;
a base fitted with contact pins, said filaments being connected in parallel to a first and a second of said contact-pins, said cathodes being respectively connected to a third, a fourth and a fifth of said contact-pins;
and means for performing an external check on emission of one of the three electron guns and for indirectly checking at the same time heating of said one gun, said checking means comprising an ancillary test circuit and an additional electrode constitution an anode inserted in proximity to the cathode and intermediate the cathode and grid of said one gun so as to form a diode with said cathode, said anode being connected to a sixth contact-pin within the interior of the tube, said sixth pin being adapted to be connected externally to an associated supply circuit via said ancillary test circuit.

2. A polychrome cathode-ray tube comprising:
three electron guns, each gun having a heating filament, and a cathode with an emission surface for emitting electrons;
a base fitted with contact-pins, two of said filaments being connected in parallel to a first and a second of said contact-pins, the third filament being connected by one end to one of said first and second contact-pins;
and means for performing an external check on heating of said third filament pertaining to one of the three electron guns, said check means comprising an ancillary test circuit and a lead for the connection of the other end of the third filament within the interior of the tube to a third contact-pin in order to permit separate heating and direct testing of the filament of said one gun, said third contact-pin being adapted to be connected externally to an associated supply circuit via said ancillary test circuit.

3. A polychrome cathode-ray tube comprising:
three electron guns, each gun having a heating filament, and a cathode having an emission surface for emitting electrons;
a base fitted with contact-pins, two of said filaments being connected in parallel to a first and a second of said contact-pins, the third filament being connected by one end to one of said first and second contact-pins, said cathodes being respectively connected to a third, a fourth and a fifth of said contact-pins;
and means for performing an external check on emission of one of the three electron guns and for indirectly checking at the same time heating of said one gun, said checking means comprising an ancillary test circuit and an additional electrode constituting an anode inserted in proximity to the cathode of said one gun so as to form a diode with said cathode, said anode being connected to a sixth contact-pin within the interior of the tube, and a lead for the connection of the other end of the third filament within the interior of the tube to a seventh contact-pin in order to permit separate heating and direct testing of the filament of said one gun, said sixth and seventh contact-pins being adapted to be connected externally to an associated supply circuit via said ancillary test circuit.

4. A cathode-ray tube according to claim 1 or claim 3, comprising a control grid, and wherein the additional anode is inserted between the cathode of said one electron gun and the control grid and opposite to the emission surface.

5. A cathode-ray tube according to claim 1 or claim 3 wherein the cathode of said one electron gun is cylindrical and has a cylindrical wall and an end wall, an emissive coating being deposited on said cylindrical wall of said cylindrical gun in addition to an emissive coating deposited on the end wall of said cylindrical gun, the aforesaid additional anode being positioned opposite to said cylindrical wall coating.

6. A cathode-ray tube according to any one of claims 1, 2 or 3, said tube having associated supply circuits including a filament-supply generating circuit and three video circuits respectively for color channels red, green and blue for producing a predetermined blocking voltage between each cathode and a control grid which is common for the three electron guns, wherein said one electron gun is the red gun and the red channel video circuit comprises an additional output which supplies the additional anode positively with respect to the cathode of said one gun, the test circuit being adapted to detect the intensity of current within connections which lead to pins connected to the test circuit.

7. A cathode-ray tube according to claim 6, wherein said tube is a shadow-mask tube of a visual display device in which the red channel is reserved for displaying a warning signal.

* * * * *